(12) United States Patent
Cheung et al.

(10) Patent No.: US 9,252,309 B2
(45) Date of Patent: Feb. 2, 2016

(54) HOT BAR SOLDERING

(75) Inventors: Dason Cheung, Fremont, CA (US);
Murad Kurwa, San Jose, CA (US);
Richard Loi, San Jose, CA (US); Mario Lopez Ruiz, Zapopan Jal (MX)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 13/564,542

(22) Filed: Aug. 1, 2012

(65) Prior Publication Data

US 2014/0034716 A1    Feb. 6, 2014

(51) Int. Cl.
| | | |
|---|---|---|
| B23K 1/00 | (2006.01) | |
| B23K 1/008 | (2006.01) | |
| B23K 1/012 | (2006.01) | |
| H01L 31/048 | (2014.01) | |
| B23K 1/20 | (2006.01) | |
| B23K 3/047 | (2006.01) | |
| H01L 31/054 | (2014.01) | |

(52) U.S. Cl.
CPC ............ *H01L 31/048* (2013.01); *B23K 1/0016* (2013.01); *B23K 1/20* (2013.01); *B23K 3/0471* (2013.01); *H01L 31/0547* (2013.01); *B23K 2201/38* (2013.01); *H01L 2924/0002* (2013.01); *Y02E 10/52* (2013.01)

(58) Field of Classification Search
CPC . H05K 3/3494; H05K 3/363; B23K 2201/40; B23K 1/012; B23K 1/0016; B23K 1/008; B23K 3/04; B23K 1/002; B23K 1/018; B23K 2201/38; F27B 9/10
USPC ......................................... 228/227, 228, 230
See application file for complete search history.

(56) References Cited

U.S. PATENT DOCUMENTS

| | | | |
|---|---|---|---|
| 5,409,543 A | | 4/1995 | Panitz et al. |
| 5,770,835 A | * | 6/1998 | Sakuyama et al. ............ 219/388 |
| 6,110,322 A | | 8/2000 | Teoh et al. |
| 6,152,353 A | | 11/2000 | Sani-Bakhtiari et al. |
| 6,840,743 B2 | | 1/2005 | Herke et al. |

(Continued)

FOREIGN PATENT DOCUMENTS

| | | | |
|---|---|---|---|
| EP | 1098354 A2 | | 9/2001 |
| JP | 2002368395 A | * | 12/2002 |
| JP | 2010245309 A | * | 10/2010 |

OTHER PUBLICATIONS www.dictionary.com; "promote".*

(Continued)

*Primary Examiner* — Erin Saad
(74) *Attorney, Agent, or Firm* — Haverstock & Owens LLP (57) ABSTRACT

A solar cell module comprises a solar cell die that is soldered to a substrate. The substrate comprises one or more power contacts. A power conductor is soldered to a power contact, thereby electrically coupling the power conductor to the solar cell die. A pre-heat module heats a first side of the substrate at a first area to a first temperature for a first duration. Then, a solder heat source solders a power conductor to a power contact at a second area of the substrate at a second temperature for a second duration. The resulting solder connection at the power conductor is less prone to cold-solder defects. The temperature of the pre-heat module is controlled to promote curing of an RTV sealant used in the manufacture of the solar cell module. The temperature of the solder heat source is controlled to avoid burning and degrading of the RTV sealant.

18 Claims, 5 Drawing Sheets

(56) References Cited

U.S. PATENT DOCUMENTS

| | | |
|---|---|---|
| 8,104,666 B1 * | 1/2012 | Hwang et al. ............ 228/180.22 |
| 2002/0134422 A1 | 9/2002 | Bauman et al. |
| 2003/0000936 A1 | 1/2003 | Kim et al. |
| 2006/0008759 A1 | 1/2006 | Shiozawa |
| 2009/0308430 A1 * | 12/2009 | Everett et al. ................ 136/246 |
| 2012/0012645 A1 * | 1/2012 | Motomura et al. ........ 228/179.1 |
| 2012/0273559 A1 | 11/2012 | Patterson et al. |

OTHER PUBLICATIONS www.dictionary.com; "overlap".*
JP 2002368395 A computer english translation.*
Office action mail date: Jun. 4, 2013, U.S. Appl. No. 13/564,568, filed Aug. 1, 2012, Dason Cheung et al., 9 pages.

* cited by examiner

HOT BAR SOLDERING

FIELD OF THE INVENTION

The present invention relates to the field of electrical coupling of an electronic component to a power conductor at a power contact on a substrate. More specifically, the present invention relates to pre-heating a substrate to protect the substrate from damage when a high temperature solder joint is made to a contact on the substrate and to avoid overheating of the solar cell and RTV adhesive during a solder reflow process.

BACKGROUND OF THE INVENTION

A solar cell module comprises a solar cell die soldered to a substrate having a plurality of electrical traces terminating in at least two power contacts output onto a surface of the substrate. A solar cell die housing, termed a cowling, is coupled to the substrate with a curable sealant such as a room temperature vulcanization (RTV) sealant. Curing of the sealant can be accelerated by application of heat, but the application of too much heat can degrade the bonding strength and change the properties of the RTV sealant. Also, excessive heat may expand the RTV rapidly, squeezing the RTV, leaking the RTV out to the cowling that may result in an electrical contact problem in addition to the leakage of the RTV.

After the solar cell die housing is coupled to the substrate, a power conductor is coupled to a power contact on the substrate, thereby electrically coupling the solar cell die to the power conductor via the power contact on the substrate. The temperature at the power contact during soldering can be as high as 220° C. for a tin/lead solder process, or higher for a lead-free process. If the substrate is cold, relative to the 220° C. solder temperature, then the resulting solder joint at the power contact can comprise a solder "cold-joint" that is subject to cracking and breaking. If the temperature of the solder at the power contact is held high long enough to overcome a cold-joint, then too much heat may be transferred to the substrate, thereby burning and degrading the RTV sealant that bonds the solar cell die housing to the substrate. Further, excessive heat applied to the substrate can result in increasing the size of solder voids in the solder joint between the solar cell die and the substrate.

To address these problems, it is desirable to control the temperature of the substrate in relation to the effect of temperature upon the RTV sealant in contact with the substrate and in relation to the temperature needed to make a high quality solder joint of the power conductor to the power contact on the substrate.

SUMMARY OF THE INVENTION

To avoid defects in a solder joint of a power conductor to a power contact on a substrate and avoid melting and reflowing of an RTV sealant that couples a solar cell die housing to the substrate, the substrate is pre-heated to a predetermined temperature in a first area of the substrate for a predetermined period of time. Pre-heating the substrate also pre-heats a power contact on the substrate. By pre-heating the substrate to a controlled temperature, the pre-heated substrate will avoid burning of an RTV sealant that couples a solar cell die housing to the substrate. Heating of the substrate is controlled by a first heat source. Heating of the solder joint that couples the power conductor to the power contact is controlled by a second heat source termed a "hot bar". Pre-heating of the substrate before soldering to a power contact on the substrate can also be used with other types of electronic components that are soldered to a substrate, particularly components that comprise an RTV sealant that may burn and degrade at the temperature of soldering.

The systems and methods described herein are able to be incorporated with systems and methods of reducing a void in a solder joint between a solar cell die and a substrate as described in U.S. patent application Ser. No. 13/564,568 entitled "VACUUM REFLOW VOIDING REWORK SYSTEM", filed on the same day as this application, by inventors Dason Cheung and Richard Loi, which is hereby incorporated by reference in its entirety for all purposes.

In a first aspect, a method of soldering a power conductor to a power contact, the method practiced upon an electronic component module having an electronic component soldered to a substrate at a first area of the substrate and having a power contact at a second area of the substrate, the method comprises pre-heating the first area of the substrate to a first temperature for a first duration and soldering the power conductor to the power contact at the second area of the substrate at a second temperature for a second duration. Preferably, the electronic component is a solar cell die and the electronic component module is a solar cell module. In some embodiments, the first temperature is in a range of 90° C. to 120° C. on the substrate surface during the first duration. In some embodiments, the second temperature is in a range of 215° C. to 245° C. In one embodiment, the second temperature heat source is set to approximately 330° C. to achieve the desired temperature range during the second duration. In a preferred embodiment, the first duration overlaps with the second duration. The method preferably further comprises increasing the first temperature to between 150° C. and 170° C. In one embodiment, the method further comprises reducing the pre-heating temperature at the first area, thereby controllably cooling the substrate, the power contact, the power conductor, and the solder joint of the power contact and the power conductor. The first area is a first surface of the substrate. Pre-heating the first area of the substrate to a first temperature results in heating of the power contact. In some embodiments, soldering the power conductor to the power contact at the second area of the substrate at the second temperature comprises heating a second surface of the substrate. In a preferred embodiment, the selection of at least one of the first temperature and the first duration promotes curing of a sealant in the electronic component module. In another preferred embodiment, the selection of at least one of the first temperature and the first duration avoids melting and reflow of a sealant in the electronic component module.

In a second aspect, a system for soldering a power conductor to a power contact of an electronic component module, the electronic component module comprising an electronic component soldered to a substrate at a first area of the substrate and having a power contact at a second area of the substrate, the system comprising a pre-heating source thermally coupled to the substrate and configured to pre-heat the first area of the substrate to a first temperature for a first duration and a soldering heat source thermally coupled to the power conductor and the power contact and configured to solder the power conductor to the power contact at a second temperature at a second area of the substrate for a second duration. In some embodiments, the the pre-heating source generates temperatures in a range of ambient temperature to 150° C. In one embodiment, the pre-heating source comprises a plurality of independently controllable heating modules. In some embodiments, the pre-heating source comprises a Peltier thermo-electric cooler. The pre-heating source is configured to heat the first area of the substrate on a first side of the substrate. In some embodiments, the soldering heat source is generates temperatures in a range of 200° C. to 400° C. In some embodiments, the soldering heat source is configured to heat the second area of the substrate on a second side of the substrate.

Throughout the disclosure, reference is made to a solar module comprising a solar cell die soldered to a substrate. One skilled in the art will recognize that the disclosure applies generally to a component soldered to a substrate having a power contact to which a power conductor is to be soldered, such as a diode array.

DETAILED DESCRIPTION OF THE INVENTION

In the detailed description of the drawings that follows, the embodiments described are intended to illustrate features of the presently-claimed invention. Similar labels refer to similar or identical elements.

Figure 1A:
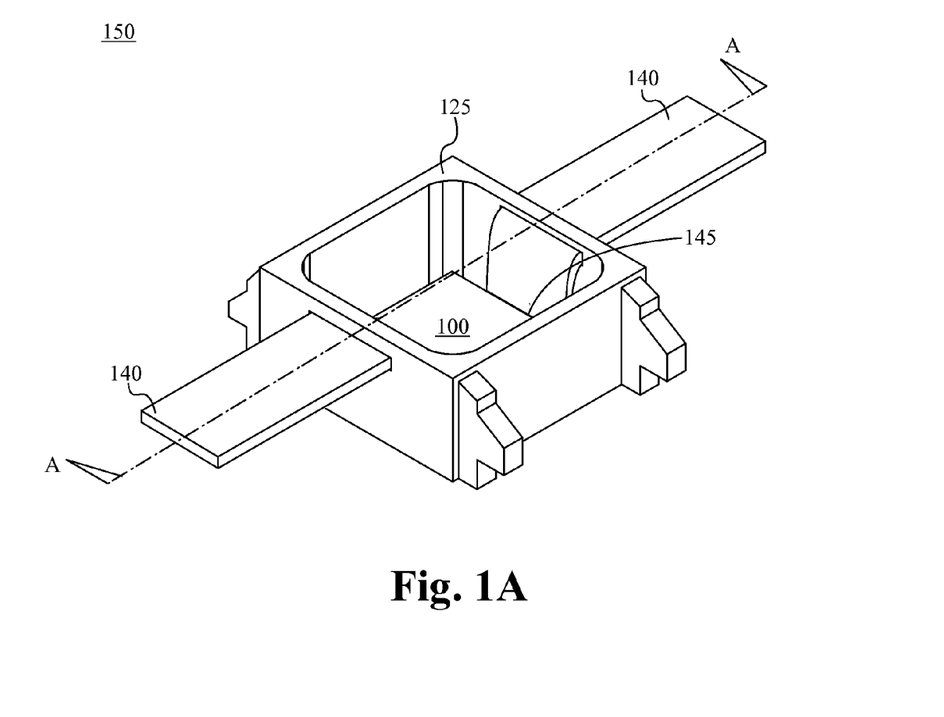
FIG. 1A illustrates a solar cell module installed in a cowling according to some embodiments.

FIG. 1A illustrates a mounted solar cell module 150 comprising a solar cell module 100 installed in a cowling 125 according to some embodiments. A conductor 140 enters the cowling 125 from each of two opposing sides. Each conductor 140 is soldered 145 to a contact on the solar cell module 100. The cowling 125 receives a solar cell die 100 that is soldered to the substrate 120, electrically coupling the solar cell die 100 to the electrical traces on the first surface of the substrate 120. The electrical traces terminate in a power contact 145 located on the first surface of the substrate 120. A power conductor 140 is electrically coupled to the power contact 145 by a soldering process as described below.

Figure 1B:
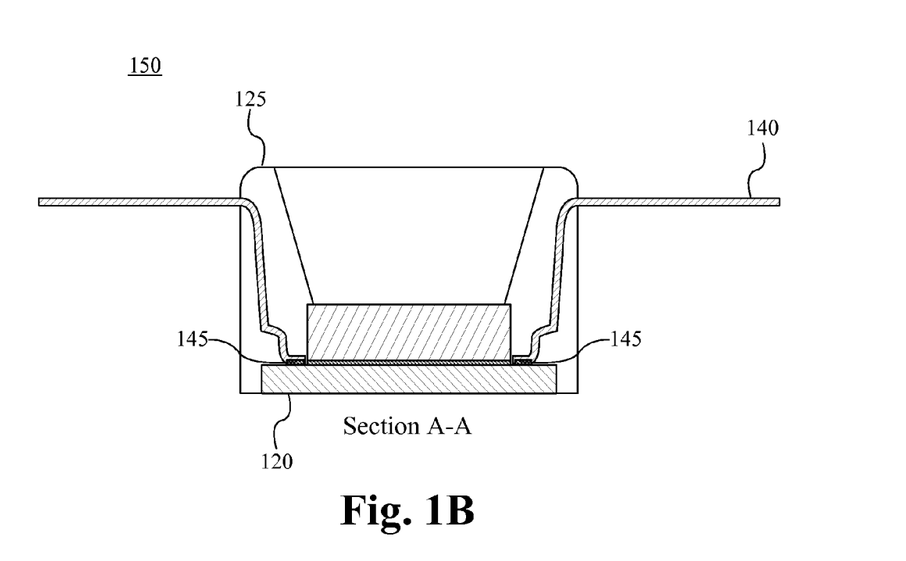
FIG. 1B is a sectional view of a solar cell module installed in a cowling according to some embodiments.

FIG. 1B is a sectional view of a mounted solar cell module 150 according to some embodiments. The cowling 125 is coupled to the substrate 120 using a room temperature vulcanization (RTV) sealant (not shown). The solar cell die 100 is soldered onto the substrate 120. The power conductor 140 is soldered to the power contact 145 on the substrate 120.

Figure 2:
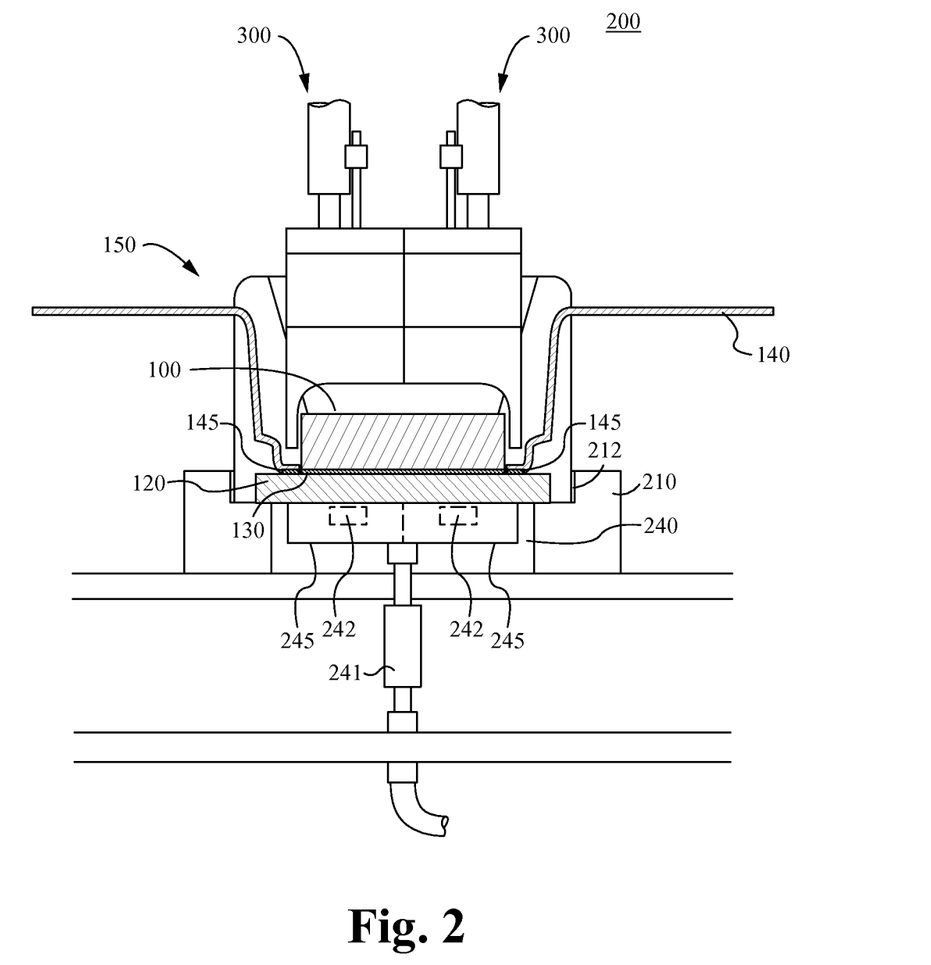
FIG. 2 illustrates a side cross-sectional view of a system for soldering a plurality of power conductors to a plurality of power contacts of a solar cell module according to some embodiments.

FIG. 2 illustrates a side cross-sectional view of a system 200 for soldering the power conductor 140 to the power contact 145 of the mounted solar cell module 150 according to some embodiments. As shown in FIGS. 1A and 1B, the mounted solar cell module 150 comprises the solar cell die 100 soldered 130 to the substrate 120. The substrate 120 comprises a plurality of electrical traces (not shown) that terminate in one or more power contacts 145. The cowling 125 is coupled to the substrate 120 using an RTV sealant (not shown). The mounted solar cell module 150 is received by a solar cell module soldering mount 210. The soldering mount 210 comprises a recessed area 212 into which the mounted solar cell module 150 is placed. A pre-heat module 200 comprises a pre-heat source 240 that is thermally coupled to the substrate 120 of the mounted solar cell module 150.

Figure 5:
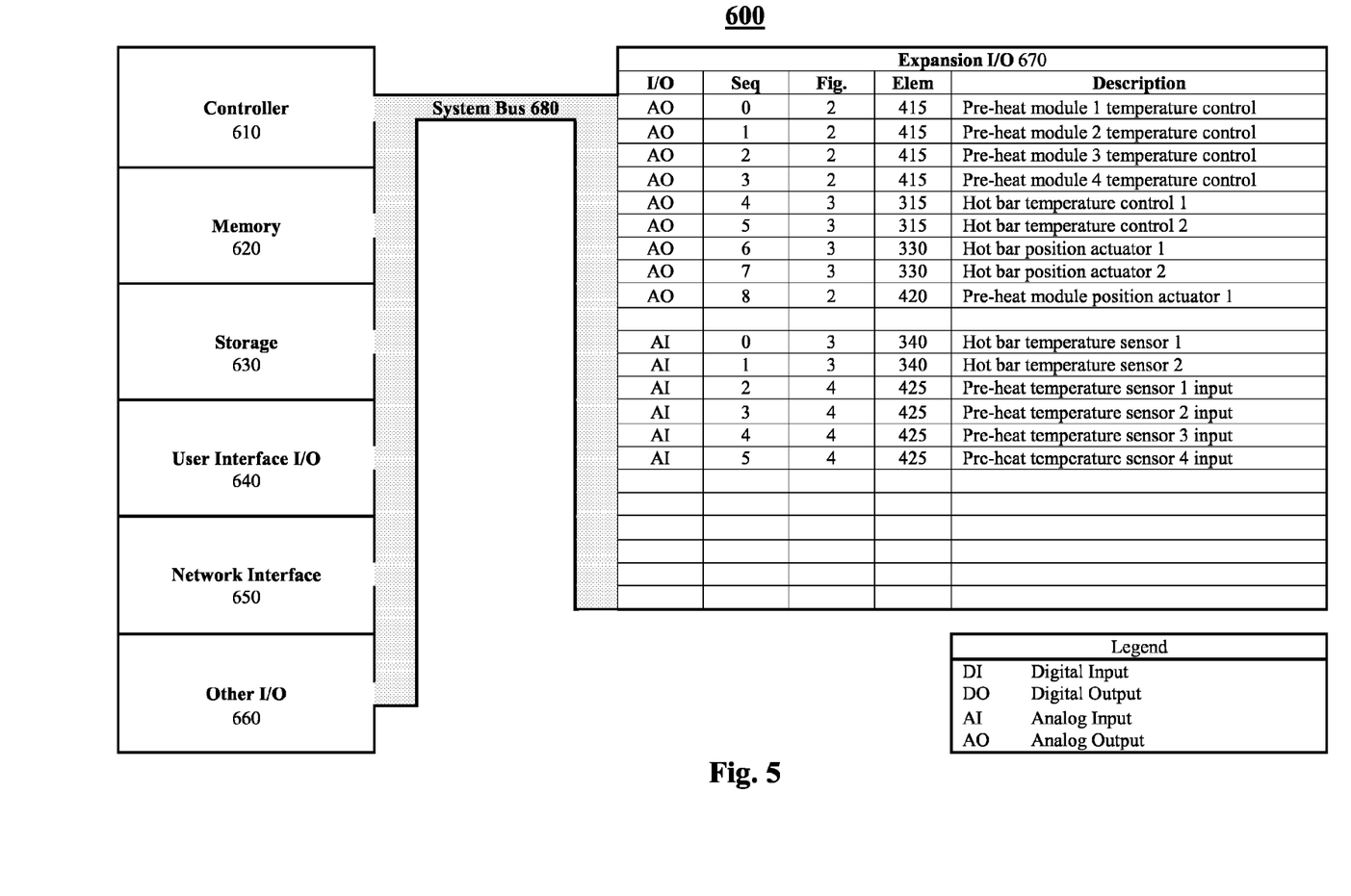
FIG. 5 illustrates a control system for controlling a hot bar soldering system implementing a method of soldering a plurality of power conductors to a plurality of power contacts on a substrate according to some embodiments.

A pre-heat module 200 comprises a pre-heat source 240 coupled to a pre-heat actuator 241 for bringing the pre-heat source 240 into thermal contact with the substrate 120. The pre-heat source 240 spans the location of the one or more power contacts 145 on the substrate 120 such that heat is applied to the substrate 120 and heat is thereby also applied to the one or more power contacts 145. The pre-heat source 240 comprises a plurality of pre-heat source modules 245, each independently controllable and each comprising a temperature sensor 242 for interfacing to a control system as shown in FIG. 5 and as described below. A hot bar solder module 300, shown in FIG. 3 and described below, solders the power conductor 140 to the power contact 145. As shown in FIG. 2, two hot bar solder modules 300 are in a side-by-side, mirror image configuration.

Figure 3:
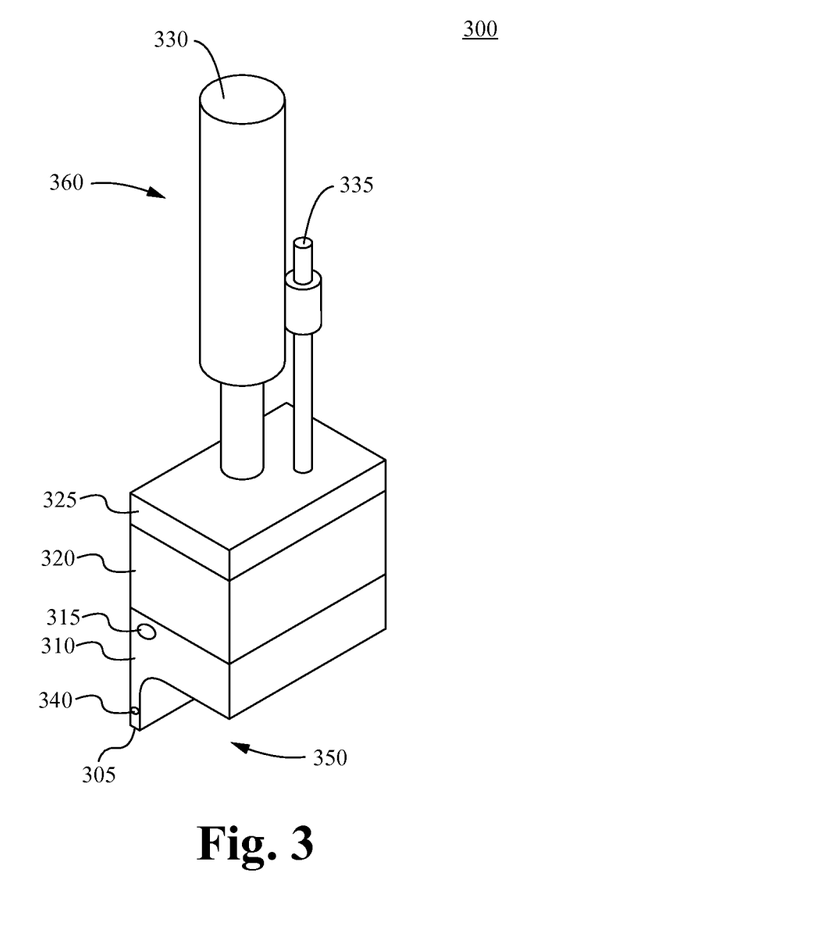
FIG. 3 illustrates a side cross-sectional view of a subsystem for soldering a power conductor to a power contact of a solar cell module according to some embodiments.

FIG. 3 illustrates a side cross-sectional view of a hot bar solder module 300 for soldering a power conductor 140 to a power contact 145 as shown in FIG. 2. A heating element 315 is installed in a high temperature portion 310 of the hot bar solder module 300. The heating element 315 is controllable over its operating temperature range by a control system 600 as shown in FIG. 5 and as described below. The high temperature portion 310 further comprises a heat sensor 340 for use in closed-loop feedback control of the heating element 315. The high temperature portion 310 is isolated from a high temperature actuation module 360 by a thermal insulation portion 320. The high temperature actuation module 360 comprises a high temperature actuator plate 325, a high temperature positioning actuator 330, and a high temperature actuator guide 335. The high temperature positioning actuator 330 and guide 335 position the high temperature portion 310 such that a hot bar soldering surface 305 is in thermal contact with a power conductor 140, a power contact 145, solder, or any combination thereof. The high temperature portion 310 comprises the hot bar soldering surface 305 and a recessed area 350. The recessed area 350 permits the hot bar soldering surface 305 to heat the power contact 145 without the high temperature portion 310 contacting the solar cell die 100.

Figure 4:
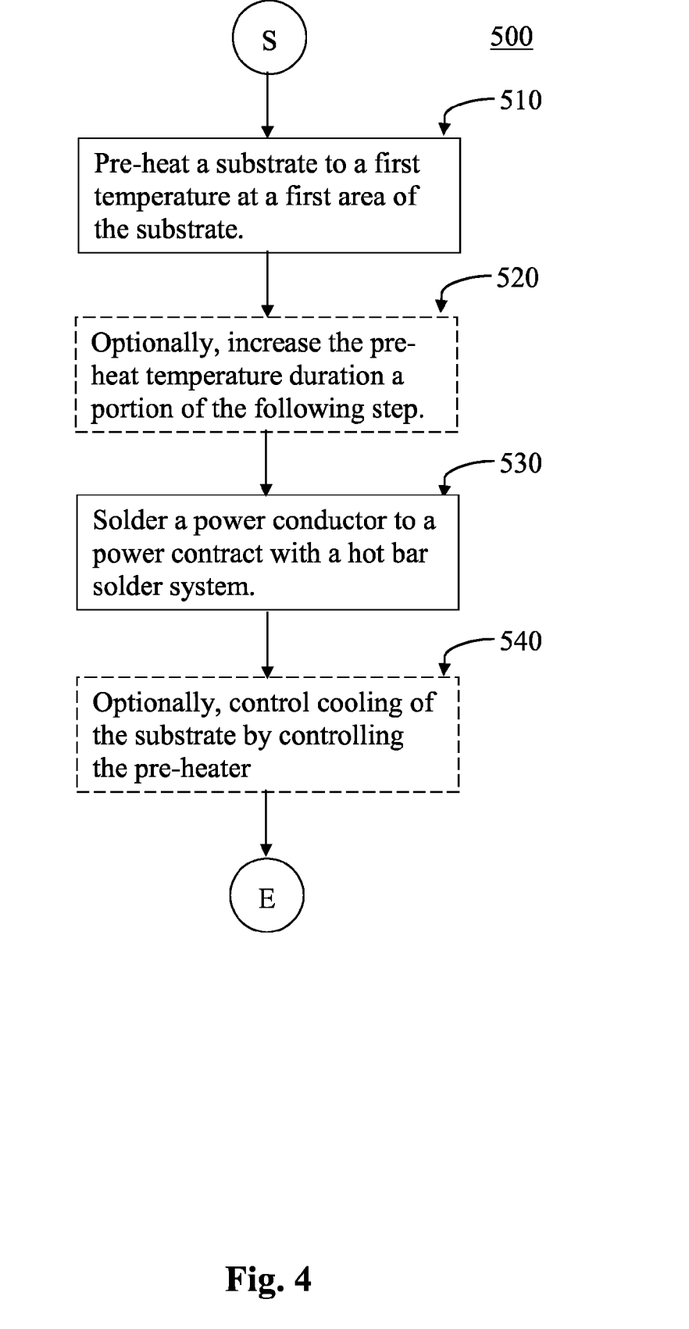
FIG. 4 illustrates the steps of a method of soldering a power conductor to a power contact on a substrate according to some embodiments.

FIG. 4 illustrates the steps 500 of a method of soldering a power conductor 140 to a power contact 145 on a substrate 120 according to some embodiments. At step 510, a pre-heat module 240 is pre-heated to a first temperature at a first area of the substrate 120 and brought into thermal contact with the substrate 120. Preferably, the first temperature is in a range 90° C. to 120° C. and the first area thermally encompasses an area of the substrate 120 that comprises a solder joint 130 of a solar cell die 100 soldered to the substrate 120 and a power contact 145 on the substrate 120 adjacent to the solar cell die 100. At an optional step 520, the pre-heat temperature is increased, preferably to 150° C., for a duration of time that overlaps with the following step 530. At step 530, a hot bar solder module 300 is heated to a second temperature and brought into thermal contact with the power contact 145, the power conductor 140, solder, or any combination thereof, to carry out soldering of the power conductor 140 to the power contact 145. At an optional step 540, a controlled cooling step is performed to optimize the strength of the solder joint and to prevent high thermal gradients that may crack the substrate or result in a solder cold-joint. The controlled cooling step is accomplished by a controlled reduction of the pre-heat module 240 temperature, controlled cooling such as with a Peltier cooler, application of a controlled-temperature air flow, or any combination thereof.

FIG. 5 illustrates a control system 600 for implementing a method of soldering a plurality of power conductors 140 to a plurality of power contacts 145 according to some embodiments. The control system 600 comprises a controller 610, a memory 620, storage 630, a user interface I/O port 640, a network interface 650, other I/O 660, and an expansion I/O module 670, all communicatively coupled by a system bus 680. The controller 610 executes instructions programmed into the storage 630 and read into the memory 620. The programmed instructions carry out the method steps 500 for soldering a power conductor 140 to a power contact 145. In one embodiment, other I/O 660 comprises interrupt lines, timer/counter inputs and outputs, communications lines such as Clocked Serial I/O, I²C, USB, RS232, RS485, and other communications protocols. The expansion I/O module 670 comprises analog inputs (AI), analog outputs (AO), digital inputs (DI) and digital outputs (DO). Analog outputs control the pre-heat modules 245, the hot bar heating elements 315, the hot bar solder position actuators 330, and the pre-heat module position actuator 241. Analog inputs include the hot bar temperature sensors 340 and the pre-heat module sensors 245. One skilled in the art would recognize other similar control schemes exemplified by the control system shown in FIG. 5. A user interface for obtaining user inputs and for providing information to the user can be coupled to the control system via the User Interface I/O port 640.

Heating Means

In one embodiment, a pre-heat module (e.g., element 200 of FIG. 2) of the solar cell module substrate 120 comprises a resistance element and a current driver. Alternatively, a high-powered Peltier thermo-electric cooler is used. Pre-heating can also be achieved by pulsed or continuous wave laser. Other pre-heating means include heat from a heat source fluidly coupled to the substrate 120, such as a heated atmosphere, a plasma, or a flame. The pre-heat module 200 is preferably controllable over a temperature range from ambient to 200° C. The pre-heat module 200 can further comprise a heat sensor for each pre-heat module, the heat sensor providing closed loop feedback for accurate control of the corresponding pre-heat module. A pre-heat module can be controlled using a servo algorithm such as a proportional, integral, derivative (PID) servo algorithm or a time proportional control servo algorithm. One skilled in the art will recognize other heat control algorithms that can be used in accordance with the embodiments.

A hot bar solder module is able to comprise any of the above heat sources described for the pre-heat module, controlled in a like manner. Temperature ranges for the hot bar solder module depend upon the type of solder used in the solder process. Typical temperatures can range from 200 C.° to 400 C.°.

Methods of soldering have been described herein as comprising discrete heating steps in relation to a step of soldering a power conductor to a power contact. One skilled in the art would recognize that in a production setting, the heat modules described herein can be maintained at certain predetermined temperatures and the heat modules are able to be brought into contact with a specific workpiece, then withdrawn from the workpiece, to reduce the application of heat to the workpiece. For example, a pre-heat module can be maintained at 150° C. and a hot bar solder surface can be maintained at 330° C. When a substrate is to be heated, the pre-heat module is brought into thermal contact with the substrate for a first duration of time. The hot bar solder surface is then brought into thermal contact with a power conductor, a power contact, solder, or any combination thereof, then removed from thermal contact after a second duration of time. Similarly, the pre-heat source can be removed from the substrate when heat is no longer needed.

Programmed Cycle Operation

In one embodiment, a soldering operation is performed using a pre-programmed cycle based upon variable inputs, some of which can be pre-programmed into the controller 610. Variables include the characteristics of the power conductor 140, such as wire gauge and material type, the material type and thickness of a power contact 145, the thickness and material type of the substrate 120, and the material and thickness of the solder joint between a solar cell die and the substrate 120. Some of these variables will be relatively constant based upon the specifications of a particular solar cell module, power conductor, and power contact. An operator of a soldering system can select a particular solar cell module type with pre-programmed specifications for soldering. Other parameters include specifying a heat source ramp rate, cycle duration, heat source ramp down rate, cooling rate for Peltier heat sources, and cycle duration.

Actuator Means

As described above, the heater module 240 can be positioned under, and retracted from, the underside of the substrate 120 of amounted solar cell module 150 in the lower assembly mount 210 by means of an actuator 241. As also described above, the upper vacuum cover 275 can be positioned onto, and retracted from, the cowling 125 of a mounted solar cell module 150 by means of actuators 270. In FIGS. 3-5, the actuators 241 and 270 are shown as pneumatic actuators, driven by air sources 260 and 262. One skilled in the art will recognize that the actuators could alternatively be hydraulically operated, electrically operated, or manually operated.

The present invention has been described in terms of specific embodiments incorporating details to facilitate the understanding of principles of construction and operation of the invention. Such reference herein to specific embodiments and details thereof is not intended to limit the scope of the invention. It will be readily apparent to one skilled in the art that other various modifications are able to be made to the embodiments chosen for illustration without departing from the spirit and scope of the invention as defined by the appended claims.

What is claimed is:

1. A method of soldering a power conductor to a power contact, the method practiced upon an electronic component module having an electronic component soldered to a substrate at a first area of the substrate and having the power contact at a second area of the substrate, the method comprising:
    pre-heating the first area of the substrate to a first temperature for a first duration starting at T0 and ending at T2;
    generating heat by a separate heat element in each of two protruding edges of a hot solder module, thereby separately causing the two protruding edges to heat up, wherein the hot solder module includes an open channel between the two edges;
    selectively contacting the power conductor with the two protruding edges to solder the power conductor to the power contact at the second area of the substrate at a second temperature for a second duration starting at T1 and ending at T3, wherein the first duration overlaps the second duration such that T0<T1<T2; and increasing the first temperature during at least a portion of the time that the first duration overlaps the second duration.

2. The method of claim 1, wherein the electronic component comprises a solar cell die and the electronic component module comprises a solar cell module.

3. The method of claim 1, wherein pre-heating the first temperature is in a range 90° C. to 120° C.

4. The method of claim 1, wherein the second temperature is in a range of 215° C. to 245° C.

5. The method of claim 1, wherein the second temperature is 330° C. and the second duration is 10 seconds.

6. The method of claim 1, the first temperature is increased to between 150° C. and 170° C. during the at least a portion of the time that the first duration overlaps the second duration.

7. The method of claim 1, further comprising reducing the temperature at the first area, thereby controllably cooling the substrate, the power contact, the power conductor, and the solder joint of the power contact and the power conductor.

8. The method of claim 1, wherein the first area comprises a first surface of the substrate.

9. The method of claim 8, wherein pre-heating the first area of the substrate to a first temperature results in heating of the power contact.

10. The method of claim 1, wherein soldering the power conductor to the power contact at the second area of the substrate at the second temperature comprises heating a second surface of the substrate.

11. The method of claim 1, wherein the selection of at least one of the first temperature and the first duration promotes curing of a sealant in the electronic component module.

12. The method of claim 1, wherein the selection of at least one of the first temperature and the first duration avoids melting and reflow of a sealant in the electronic component module.

13. The method of claim 2, wherein selectively contacting the power conductor with the two protruding edges includes positioning the hot bar solder module including a hot bar soldering surface and a recessed area, wherein the hot bar solder module is positioned such that the recessed area is over the electronic component and the hot bar soldering surface heats the power contact without contacting the solar cell die.

14. The method of claim 13, wherein the hot bar solder module further includes a positioning actuator and guide for positioning the hot bar soldering surface in thermal contact with at least one of the power conductor, the power contact, and solder.

15. The method of claim 2, wherein pre-heating the first area of the substrate includes positioning a pre-heat source beneath the substrate such that the pre-heat source is in thermal contact with the substrate.

16. The method of claim 15, wherein the pre-heat source spans a location of the power contact on the substrate and for heating the power contact.

17. The method of claim 16, wherein the pre-heat source includes a plurality of pre-heat source modules, each independently controllable.

18. The method of claim 17, further comprising retracting the pre-heat source away from an underside of the substrate, wherein the retraction is from within a mount that is configured to receive the electronic component module such that the substrate remains stationary during the positioning and the retraction of the pre-heat source.

* * * * *